United States Patent
Liu

(10) Patent No.: US 10,312,874 B2
(45) Date of Patent: Jun. 4, 2019

(54) VOLUME CONTROL METHODS AND DEVICES, AND MULTIMEDIA PLAYBACK CONTROL METHODS AND DEVICES

(71) Applicant: Beijing Zhigu Rui Tuo Tech Co., Ltd, Beijing (CN)

(72) Inventor: Jia Liu, Beijing (CN)

(73) Assignee: BEIJING ZHIGU RUI TUO TECH CO., LTD, Beijing (CN)

( * ) Notice: Subject to any disclaimer, the term of this patent is extended or adjusted under 35 U.S.C. 154(b) by 8 days.

(21) Appl. No.: 15/300,789

(22) PCT Filed: Mar. 12, 2015

(86) PCT No.: PCT/CN2015/074069
§ 371 (c)(1),
(2) Date: Sep. 30, 2016

(87) PCT Pub. No.: WO2015/149613
PCT Pub. Date: Oct. 8, 2015

(65) Prior Publication Data
US 2017/0033753 A1 Feb. 2, 2017

(30) Foreign Application Priority Data

Apr. 4, 2014 (CN) .......................... 2014 1 0136924

(51) Int. Cl.
*H03G 3/30* (2006.01)
*H04N 21/422* (2011.01)
(Continued)

(52) U.S. Cl.
CPC ........... *H03G 3/3005* (2013.01); *G06F 3/165* (2013.01); *H04N 21/42203* (2013.01);
(Continued)

(58) Field of Classification Search
CPC .......... H04N 21/436; H04N 21/44203; H04N 21/43615; H04N 21/44218; H04N 21/47217; H03G 3/3005
See application file for complete search history.

(56) References Cited

U.S. PATENT DOCUMENTS

| 7,800,583 | B2 | 9/2010 | Kato |
| 8,422,953 | B2 | 4/2013 | Hino et al. |
(Continued)

FOREIGN PATENT DOCUMENTS

| CN | 101281726 A | 10/2008 |
| CN | 201222732 Y | 4/2009 |
(Continued)

OTHER PUBLICATIONS

International Search Report for PCT Application No. PCT/CN2015/074069, dated Jun. 16, 2015, 3 pages.

*Primary Examiner* — Hunter B Lonsberry
(74) *Attorney, Agent, or Firm* — Amin, Turocy & Watson, LLP

(57) ABSTRACT

Volume control methods and control devices, and multimedia playback control methods and control devices are provided. The volume control method comprises: acquiring volume information of a first device; in response to that the acquired volume information of the first device satisfies a predetermined condition, determining at least one second device; and controlling volume of the at least one second device. When a user goes away from a multimedia playback device, multimedia playback of another device can be controlled, to cause that multimedia playback that the user watches/listens to is not affected obviously.

43 Claims, 8 Drawing Sheets

(51) Int. Cl.
*H04N 21/436* (2011.01)
*G06F 3/16* (2006.01)
*H04N 21/439* (2011.01)
*H04N 21/442* (2011.01)
*H04N 21/472* (2011.01)

(52) U.S. Cl.
CPC ..... *H04N 21/439* (2013.01); *H04N 21/43615* (2013.01); *H04N 21/44218* (2013.01); *H04N 21/47217* (2013.01)

(56) References Cited

U.S. PATENT DOCUMENTS

| | | | |
|---|---|---|---|
| 2007/0165812 | A1 | 7/2007 | Lee et al. |
| 2013/0024018 | A1 | 1/2013 | Chang et al. |
| 2013/0340014 | A1* | 12/2013 | Evans ................ H04N 21/6156 725/74 |
| 2014/0250472 | A1* | 9/2014 | Huang ............... H04N 21/4325 725/82 |
| 2015/0121435 | A1* | 4/2015 | Wang ................ H04N 21/4131 725/81 |
| 2017/0019267 | A1* | 1/2017 | Togashi ............. H04L 12/2807 |

FOREIGN PATENT DOCUMENTS

| | | |
|---|---|---|
| CN | 101431317 A | 5/2009 |
| CN | 101489091 A | 7/2009 |
| CN | 102231778 A | 11/2011 |
| CN | 102355622 A | 2/2012 |
| CN | 102891657 A | 1/2013 |
| CN | 103248999 A | 8/2013 |
| CN | 103517153 A | 1/2014 |
| CN | 103945253 A | 7/2014 |
| JP | 2006270601 A | 10/2006 |
| JP | 2007028046 A | 2/2007 |
| JP | 2007306444 A | 11/2007 |
| WO | 2010083737 A1 | 7/2010 |

* cited by examiner

US 10,312,874 B2

VOLUME CONTROL METHODS AND DEVICES, AND MULTIMEDIA PLAYBACK CONTROL METHODS AND DEVICES

RELATED APPLICATION

The present application is a U.S. National Stage filing under 35 U.S.C. § 371 of international patent cooperation treaty (PCT) application No. PCT/CN2015/074069, filed Mar. 12, 2015, and entitled "VOLUME CONTROL METHODS AND DEVICES, AND MULTIMEDIA PLAYBACK CONTROL METHODS AND DEVICES", which claims the benefit of priority to Chinese Patent Application No. 201410136924.4, filed on Apr. 4, 2014, which applications are hereby incorporated into the present application by reference herein in their respective entireties.

TECHNICAL FIELD

The present application relates to the field of control, and in particular, to volume control methods and control devices, and multimedia playback control methods and control devices.

BACKGROUND

Development of intelligent devices has brought much convenience to people's life. Because an intelligent device is integrated with a central processing unit (CPU), an operating system, various communications interfaces, and the like, an intelligent device having a sound or video playback capability not only can acquire playback content from Internet, but also can run an application program or communicate with another intelligent device.

Meanwhile, requirements of a user for playback of an intelligent device should be further satisfied in some application scenarios. For example, when a user who is watching an intelligent television or listening to an intelligent acoustic device in a living room leaves temporarily and enters another room, the user may expect that multimedia playback that the user watches/listens to at this period of time is not affected.

SUMMARY

An example, non-limiting objective of the present application is to provide a volume control technology and a multimedia playback control technology.

According to one example aspect of the present application, a volume control method is provided, and comprises:
acquiring volume information of a first device;
in response to that the acquired volume information of the first device satisfies a predetermined condition, determining at least one second device; and
controlling volume of the at least one second device.

According to another example aspect of the present application, a volume control method is provided, and comprises:
acquiring volume information of a first device; and
in response to that the acquired volume information of the first device satisfies a predetermined condition, controlling volume of a control device.

According to another example aspect of the present application, a control device is provided, and comprises:
an acquisition module, configured to acquire volume information of a first device;
a determining module, configured to: in response to that the acquired volume information of the first device satisfies a predetermined condition, determine at least one second device; and
a control module, configured to control volume of the at least one second device.

According to another example aspect of the present application, a control device is provided, and comprises:
an acquisition module, configured to acquire volume information of a first device; and
a control module, configured to: in response to that the acquired volume information of the first device satisfies a predetermined condition, control volume of the control device.

According to another example aspect of the present application, a multimedia playback control method is provided, and comprises:
acquiring volume information of a first device; and
in response to that the acquired volume information of the first device satisfies a predetermined condition, determining at least one second device; and
controlling multimedia playback of the at least one second device.

According to another example aspect of the present application, a multimedia playback control method is provided, and comprises:
acquiring volume information of a first device; and
in response to that the acquired volume information of the first device satisfies a predetermined condition, controlling multimedia playback of a control device.

According to another example aspect of the present application, a control device is provided, and comprises:
an acquisition module, configured to acquire volume information of a first device;
a determining module, configured to: in response to that the acquired volume information of the first device satisfies a predetermined condition, determine at least one second device; and
a control module, configured to control multimedia playback of the at least one second device.

According to another example aspect of the present application, a control device is provided, and comprises:
an acquisition module, configured to acquire volume information of a first device; and
a control module, configured to: in response to that the acquired volume information of the first device satisfies a predetermined condition, control multimedia playback of the control device.

In the methods and devices of various embodiments of the present application, when a user goes away from a multimedia playback device, multimedia playback of another device can be controlled, to cause that multimedia playback to which the user watches/listens is not affected obviously.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
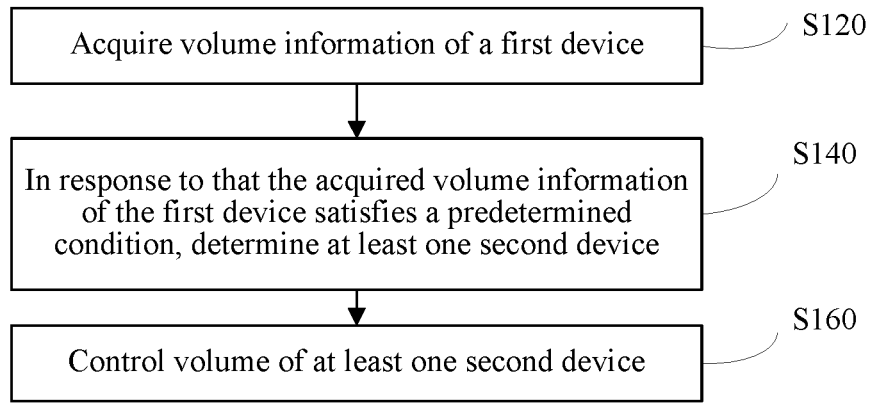
FIG. 1 is an example flowchart of steps of a volume control method according to an example embodiment of the present application.

The following further describes the various embodiments of the present application in detail with reference to the accompanying drawings (the same reference numeral in the drawings indicates the same element) and embodiments. The following embodiments are descriptive of various details, rather than limiting the scope of the present invention.

A person skilled in the art may understand that, terms such as "first" and "second" in the present application are merely used to distinguish different steps, devices, modules, or the like, and neither represent any specific technical meanings, nor represent any necessary logic sequence between the steps, devices, modules, or the like.

In an example embodiment of the present application, a user who is listening to a sound signal played by a first device needs to go away from the first device, but does not expect that volume of the sound signal that is listened to is affected obviously; in this case, a control device carried by the user may discover and determine a second device, having a sound playback capability, near the user, and enable the second device to play the same sound signal and control volume of the second device, to cause that volume of the sound signal that the user listens to is not affected obviously.

In the foregoing example embodiments, the "first device" and the "second device" may be any intelligent device having a sound playback capability, and can perform data or signal transmission with another device in a wireless manner, wherein the wireless manner may be any one of wireless data transmission manners such as Bluetooth, Wi-Fi, and Zigbee. In some cases, the "first device" and the "second device" may also have a video playback capability. The "control device" may be an intelligent user-wearable device or portable device or the like, and has a capability of receiving volume-related sound information and at least one control capability, comprising volume control, of controlling another intelligent device in a wireless manner.

According to the foregoing example embodiments, as shown in FIG. 1, a volume control method is provided, wherein the method may be implemented, for example, by a control device carried by a user. The method comprises:

S120: Acquire volume information of a first device.

S140: In response to that the acquired volume information of the first device satisfies a predetermined condition, determine at least one second device.

S160: Control volume of the at least one second device.

The following describes specific functions of the steps of the volume control method of this embodiment of the present application with reference to FIG. 1.

S120: Acquire the volume information of the first device.

In an example embodiment, the control device carried by the user may obtain the volume information by receiving a sound signal played by the first device.

Specifically, the control device may directly receive, by using a microphone or the like of the control device, a sound signal sent by a loudspeaker of the first device (such as an intelligent television or an intelligent acoustic device in a living room), and acquire volume information of the sound signal. A person skilled in the art may acquire the volume information from the received sound signal by using the existing art, wherein the volume information is used for representing volume (a sound intensity) of the sound signal received by the control device from the first device, for example, the volume may be represented by using "decibel" as the unit.

S140: In response to that the acquired volume information of the first device satisfies the predetermined condition, determine the at least one second device.

When the user goes away from the first device that is playing the sound signal, a sound intensity of the sound signal that is sent by the first device and received by the control device carried by the user may decrease; therefore, the acquired volume information decreases. When the volume information decreases to certain degree, listening of the user to the sound signal sent by the first device is affected. In this embodiment of the present application, the control device carried by the user may control volume of an intelligent device, having a sound playback function, near the user, to cause that the intelligent device plays the sound signal with appropriate volume, thereby satisfying listening requirements of the user.

For determining a decreasing degree of the volume information, in an example embodiment, a first threshold may be preset (for example, a decibel value is preset), and that the volume information is less than the first threshold is used as the predetermined condition. When the preset condition is satisfied, the control device determines that the listening of the user to the sound of the first device is affected, and needs to determine another sound playback device (a second device) to satisfy the listening requirements of the user.

In an example embodiment, one or more devices having a sound playback capability may periodically and actively send a respective device signal, so as to notify another intelligent device of existence and related information of the device. The device signal may comprise device-related information related to each device, wherein the device-related information may comprise information such as a device identifier (ID), device capability description, a device network address, device location information of the device. When it is determined that the volume information of the first device satisfies the predetermined condition, the control device may receive the device signal from the at least one device, thereby determining the at least one second device according to content in the device signal. For example, when a device signal sent by an intelligent device indicates that the intelligent device has a sound playback capability, the control device may determine the intelligent device as the second device; otherwise, the control device does not determine the intelligent device as the second device.

When the control device receive device signals from multiple intelligent devices having a sound playback capability, the control device may further determine the at least one second device from the multiple intelligent devices according to a preset standard. For example, the control device may determine at least one of at least one device within a preset distance from the control device as the second device; may determine at least one of at least one device having a wireless communication intensity with the control device greater than a preset intensity as the second device; may select at least one device from at least one device having an optimal sound playback capability, so as to determine the device as the second device; and may perform determining according to the location information in the device-related information and determine at least one of at least one device that is in a same area, for example, in a same room of the control device as the second device.

Then, in the volume control method of this embodiment, the control device may further send a device signal or device-related information of the determined at least one second device to the first device, so as to notify the first device of existence and related information of the at least one second device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

In another example embodiment, when it is determined that the volume information of the first device satisfies the predetermined condition, the control device may send a query signal wirelessly in a broadcast manner, to determine whether there is another device having a sound playback capability. After receiving the query signal, one or more devices having a sound playback capability may separately send a response signal to the control device, to notify the control device of existence and related information of the device. The response signal may comprise device-related information related to a device making a response (a responding device), wherein the device-related information may comprise information such as a device ID, device capability description, a device network address, device location information of the responding device. The control device may receive the response signal from the at least one responding device, so as to determine the at least one second device from the at least one responding device according to the response signal.

After sending the query signal, when receiving response signals from multiple intelligent devices having a sound playback capability, the control device may further determine the at least one second device from the multiple responding devices according to a preset standard.

Then, in the volume control method of this embodiment, the control device may further send a response signal or device-related information of the determined at least one second device to the first device, so as to notify the first device of existence and related information of the at least one second device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

In another example embodiment, after determining the at least one second device, the control device may also receive the device-related information of the first device from the first device, and send the device-related information of the first device to the at least one second device, so as to notify the at least one second device of existence and related information of the first device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

S160: Control the volume of the second device.

After the first device sends the played sound information (and video information) to the at least one second device, the at least one second device plays the sound information (and the video information) in synchronization with the first device. In this case, the control device of the user going away from the first device playing the sound signal can control volume of the at least one second device near the user, to adjust playback volume that the user listens to. A person skilled in the art may understand that, the playback volume that the user listens to is a sum of the volume from the first device and volume from the at least one second device.

In an example embodiment, the control device may acquire the volume information of the first device and volume information of the at least one second device, and control volume of at least one of the at least one second device according to the volume information of the first device and the volume information of the at least one second device. Similar to step S120, the control device may directly receive, by using a microphone or the like of the control device, sound signals sent by loudspeakers of the first device and the at least one second device, and acquire volume information of the sound signals at the same time. In this case, the volume received by the control device is the sum of the volume from the first device and the volume from the at least one second device.

Specifically, in a process of controlling the volume of the at least one second device, the control device may compare the sum of the volume information of the first device and the volume information of the at least one second device with a preset value, so as to control the volume of the at least one second device. For example, when the sum of the volume information of the first device and the volume information of the at least one second device is greater than the preset value, the control device may communicate with the at least one second device in a wireless manner, to control the at least one second device to decrease volume; or, when the sum of the volume information of the first device and the volume information of the at least one second device is less than the preset value, the control device may communicate with the at least one second device in a wireless manner, to cause that the at least one second device increases volume.

A person skilled in the art may set the preset value according to actual needs of the user. For example, the preset value may be an appropriate multiple of the first threshold, such as any value between 2 times the first threshold to 5 times the first threshold; may be an appropriate proportion of maximum volume of the first device or any second device, such as any value between 30% to 80% of the maximum value; and may also be a volume value (a fixed decibel value) set by the user, or the like.

According to the method of this embodiment of the present application, when the user who is listening to the sound signal played by the first device needs to go away from the first device, the control device carried by the user may discover and determine a second device, having a sound playback capability, near the user, to cause that the second device plays the same sound signal and the control device controls the volume of the second device, and to cause that volume of the sound signal that the user listens to is not affected obviously.

In another example embodiment of the present application, the user who is listening to the sound signal played by the first device needs to go away from the first device, but does not expect that volume of the sound signal that is listened to is affected obviously; in this case, the control device carried by the user may play the same sound signal and control volume of the control device, to cause that volume of the sound signal that the user listens to is not affected obviously.

In the foregoing example embodiments, the "first device" may be any intelligent device having a sound playback capability, and can perform data or signal transmission with another device in a wireless manner, wherein the wireless manner may be any one of wireless data transmission manners such as Bluetooth, Wi-Fi, and Zigbee. In some cases, the "first device" may also have a video playback capability. The "control device" may be an intelligent user-wearable device or portable device or the like, and has a capability of receiving volume-related sound information and a sound playback capability, and in some cases, may also have a video playback capability.

Figure 2:
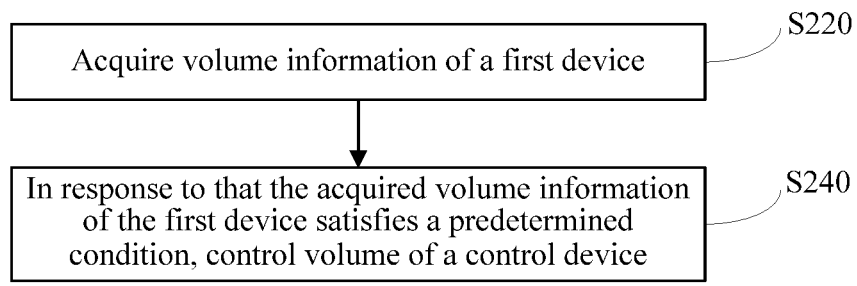
FIG. 2 is an example flowchart of steps of a volume control method according to another example embodiment of the present application.

According to the foregoing example embodiments, as shown in FIG. 2, a volume control method is provided, wherein the method may be implemented, for example, by a control device carried by a user. The method comprises:

S220: Acquire volume information of a first device.

S240: In response to that the acquired volume information of the first device satisfies a predetermined condition, control volume of the control device.

The following describes example functions of the steps of the volume control method of this embodiment of the present application with reference to FIG. 2.

S220: Acquire the volume information of the first device.

In an example embodiment, the control device carried by the user may obtain the volume information by receiving a sound signal played by the first device. Specifically, the control device may directly receive, by using a microphone or the like of the control device, a sound signal sent by a loudspeaker of the first device (such as an intelligent television or an intelligent acoustic device in a living room), and acquire volume information of the sound signal.

S240: In response to that the acquired volume information of the first device satisfies the predetermined condition, control the volume of the control device.

When the user goes away from the first device that is playing the sound signal, a sound intensity of the sound signal that is sent by the first device and received by the control device carried by the user may decrease; therefore, the acquired volume information decreases. When the volume information decreases to certain degree, listening of the user to the sound signal sent by the first device is affected. In this embodiment of the present application, in this case, the control device carried by the user can play the same sound signal and control volume of the control device, so as to play the sound signal with appropriate volume, thereby satisfying listening requirements of the user.

For determining a decreasing degree of the volume information, in an example embodiment, a first threshold may be preset (for example, a decibel value is preset), and that the volume information is less than the first threshold is used as the predetermined condition. When the preset condition is satisfied, the control device determines that the listening of the user to the sound of the first device is affected, and control device itself needs to play the sound to satisfy the listening requirements of the user.

In an example embodiment, when it is determined that the volume information of the first device satisfies the preset condition, the control device sends device-related information of the control device to the first device, so as to notify the first device of existence and related information of the control device, to cause that the first device can establish a data connection to the control device. The device-related information may comprise information such as a device ID, device capability description, a device network address, and device location information of the control device.

In another example embodiment, the control device may acquire device-relation information of the first device. In this way, the control device may send a request to the first device, to cause that the first device can establish a data connection to the control device.

Then, in the volume control method of this embodiment, the first device may send played sound information to the control device in a wired or wireless manner and the control device receives the sound information, to cause that the control device can play the sound information in synchronization with the first device. When both the first device and the control device have a video playback capability, the first device may further send played video information to the control device at the same time.

After the first device sends the played sound information (and video information) to the control device, the control device plays the sound information (and the video information) in synchronization with the first device. In this case, the control device of the user going away from the first device playing the sound signal can control volume of the control device to adjust playback volume that the user listens to. A person skilled in the art may understand that, the playback volume that the user listens to is a sum of volume from the first device and volume from the control device.

In an example embodiment, the control device may acquire the volume information of the first device and volume information of the control device, and control the volume of the control device according to the volume information of the first device and the volume information of the control device. Similar to step S220, the control device may directly receive, by using a microphone or the like of the control device, sound signals sent by loudspeakers of the first device and the control device, and acquire volume information of the sound signals at the same time. In this case, the volume received by the control device is the sum of the volume from the first device and the volume from the control device.

Specifically, in a process of controlling the volume of the control device, the control device may compare a sum of the volume information of the first device and the volume information of the control device with a preset value, so as to control the volume of the control device. For example, when the sum of the volume information of the first device and the volume information of the control device is greater than the preset value, the control device may decrease the volume of the control device; or, when the sum of the volume information of the first device and the volume information of the control device is less than the preset value, the control device may increase the volume of the control device.

A person skilled in the art may set the preset value according to actual needs of the user. For example, the preset value may be an appropriate multiple of the first threshold, such as any value between 2 times the first threshold to 5 times the first threshold; may be an appropriate proportion of maximum volume of the first device or the control device, such as any value between 30% to 80% of the maximum value; and may also be a volume value (a fixed decibel value) set by the user, or the like.

According to the method of this embodiment of the present application, when the user who is listening to the sound signal played by the first device needs to go away from the first device, the control device carried by the user may play the same sound signal and control the volume of the control device, to cause that volume of the sound signal that the user listens to is not affected obviously.

A person skilled in the art may understand that, in the foregoing methods of the example embodiments of the present application, a sequence number of each step does not imply an execution sequence, and an execution sequence of each step should be determined according to its function and internal logic. The sequence number shall not constitute any limitation to implementation processes of the example embodiments described herein.

In addition, an embodiment of the present application further provides a computer readable medium, comprising a computer readable instruction, wherein when the computer readable instruction is executed, the step operations of the method in the example embodiment shown in FIG. 1 or FIG. 2 are executed.

Figure 3:
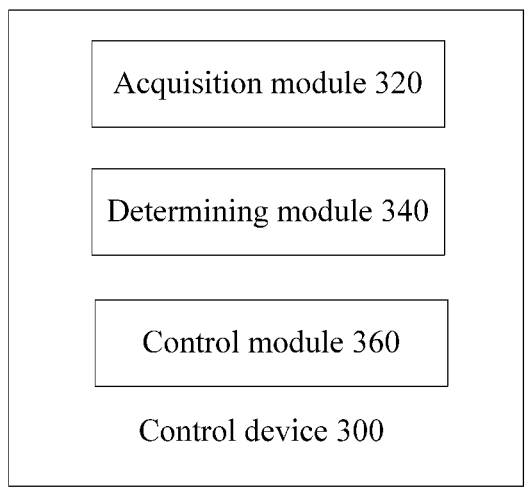
FIG. 3 is an example functional structural diagram of a control device according to an example embodiment of the present application.

Corresponding to the volume control method shown in FIG. 1, as shown in FIG. 3, another example embodiment of the present application provides a control device 300, comprising:

an acquisition module 320, configured to acquire volume information of a first device;

a determining module 340, configured to: in response to that the acquired volume information of the first device satisfies a predetermined condition, determine at least one second device; and a control module 360, configured to control volume of the at least one second device.

The following describes example functions of the modules in the control device of this embodiment of the present application with reference to FIG. 3.

The acquisition module 320 is configured to acquire the volume information of the first device.

In an example embodiment, the acquisition module 320 in the control device 300 carried by a user may obtain the volume information by receiving a sound signal played by the first device. Specifically, the acquisition module 320 may directly receive a sound signal sent by a loudspeaker of the first device, and acquire volume information of the sound signal.

The determining module 340 is configured to: in response to that the acquired volume information of the first device satisfies the predetermined condition, determine the at least one second device.

Figure 4:
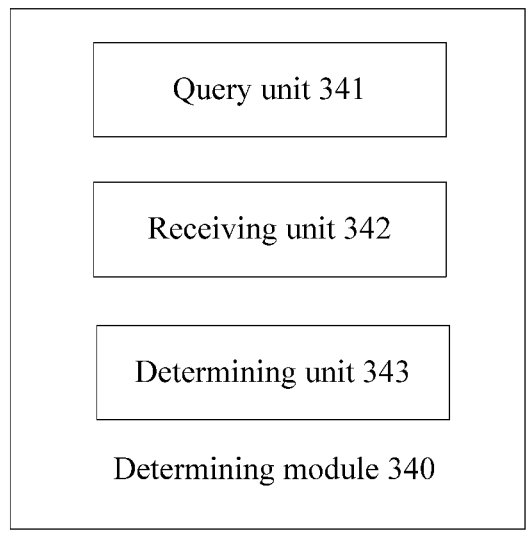
FIG. 4 is an example functional structural diagram of a determining module according to an example embodiment of the present application.

In an example embodiment, when it is determined that the volume information of the first device satisfies the predetermined condition, as shown in FIG. 4, a query unit 341 in the determining module 340 may send a query signal wirelessly in a broadcast manner, to determine whether there is another device having a sound playback capability. After receiving the query signal, one or more responding devices having a sound playback capability may separately send a response signal to the control device, to notify the control device of existence and related information of the responding device. The response signal may comprise device-related information related to the responding device, wherein the device-related information may comprise information such as a device ID, device capability description, a device network address, device location information of the responding device. A receiving unit 342 in the determining module 340 may receive the response signal from the at least one responding device, and a determining unit 343 in the determining module 340 determines the at least one second device from the at least one responding device according to the response signal.

When the receiving unit 342 receives response signals from multiple intelligent devices having a sound playback capability, the determining unit 343 may further determine the at least one second device from the multiple responding devices according to a preset standard.

Figure 5:
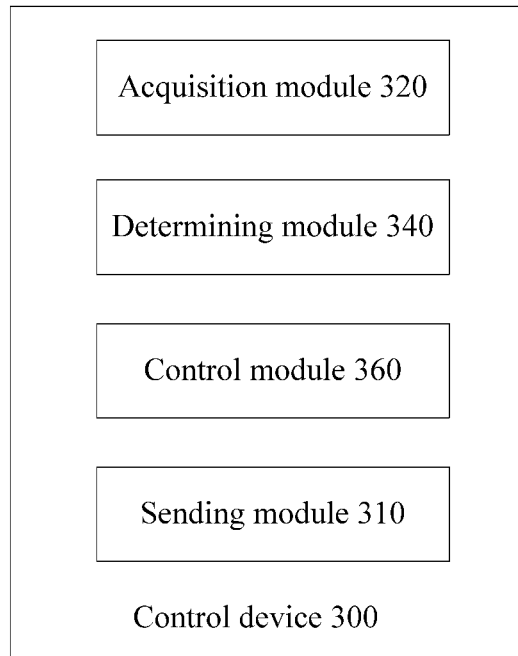
FIG. 5 is another example functional structural diagram of a control device according to an example embodiment of the present application.

Then, as shown in FIG. 5, the control device of this embodiment may further comprise a sending module 310, wherein the sending module 310 may send a response signal or device-related information of the determined at least one second device to the first device, so as to notify the first device of existence and related information of the at least one second device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

Figure 6:
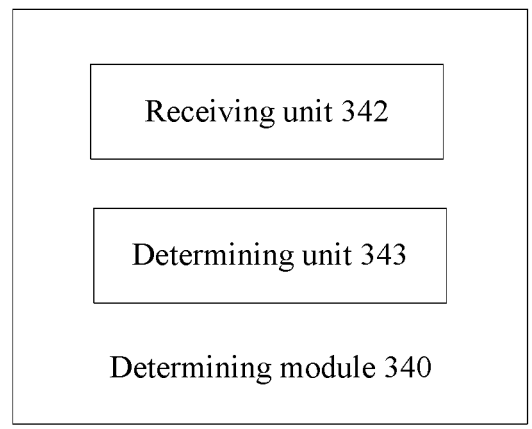
FIG. 6 is an example functional structural diagram of a determining module according to another example implementation manner of the present application.

In another example embodiment, one or more devices having a sound playback capability may periodically and actively send a respective device signal, so as to notify another intelligent device of existence and related information of the device. The device signal may comprise device-related information related to each device, wherein the device-related information may comprise information such as a device ID, device capability description, a device network address, device location information of the device. When it is determined that the volume information of the first device satisfies the preset condition, as shown in FIG. 6, a receiving unit 342 in the determining module 340 may receive a device signal from at least one device, and a determining unit 343 in the determining module 340 may determine the at least one second device from the at least one device according to the device signal.

When the receiving unit 342 receives device signals from multiple intelligent devices having a sound playback capability, the determining unit 343 may further determine the at least one second device from the multiple intelligent devices according to a preset standard.

Then, as shown in FIG. 5, the control device of this embodiment may further comprise a sending module 310, wherein the sending module 310 may send a device signal or device-related information of the determined at least one second device to the first device, so as to notify the first device of existence and related information of the at least one second device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

Figure 7:
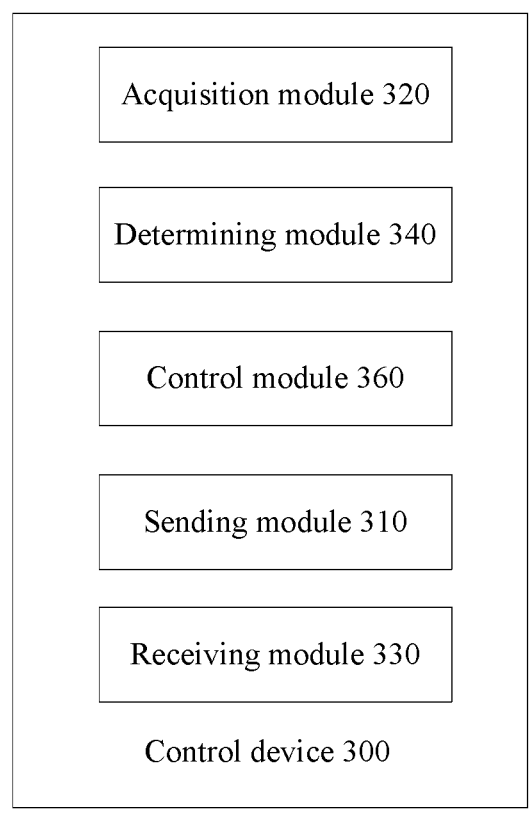
FIG. 7 is another example functional structural diagram of a control device according to an example embodiment of the present application.

In another example embodiment, after the determining module 340 determines the at least one second device, as shown in FIG. 7, a receiving module 330 in the control device 300 may also receive the device-related information of the first device from the first device, and a sending module 310 in the control device 300 sends the device-related information of the first device to the determined at least one second device, so as to notify the at least one second device of existence and related information of the first device, to cause that the first device establishes a data connection to the at least one second device. In this way, the first device may send played sound information to the at least one second device in a wired or wireless manner, to cause that the at least one second device can play the sound information in synchronization with the first device. When both the first device and the at least one second device have a video playback capability, the first device may further send played video information to the at least one second device at the same time.

The control module 360 is configured to control the volume of the at least one second device.

In an example embodiment, the acquisition module 320 in the control device 300 may acquire the volume information of the first device and volume information of the at least one second device, and the control module 360 may control volume of at least one of the at least one second device according to the volume information of the first device and the volume information of the at least one second device.

Specifically, the control module 360 may compare a sum of the volume information of the first device and the volume information of the at least one second device with a preset value, so as to control the volume of the at least one second device. For example, when the sum of the volume information of the first device and the volume information of the at least one second device is greater than the preset value, the control module 360 decreases the volume of the at least one second device; or, when the sum of the volume information of the first device and the volume information of the at least one second device is less than the preset value, the control module 360 increases the volume of the at least one second device.

According to the control device of this embodiment of the present application, when the user who is listening to the sound signal played by the first device needs to go away from the first device, the control device carried by the user may discover and determine a second device, having a sound playback capability, near the user, to cause that the second device plays the same sound signal and the control device controls the volume of the second device, and to cause that volume of the sound signal that the user listens to is not affected obviously.

Figure 8:
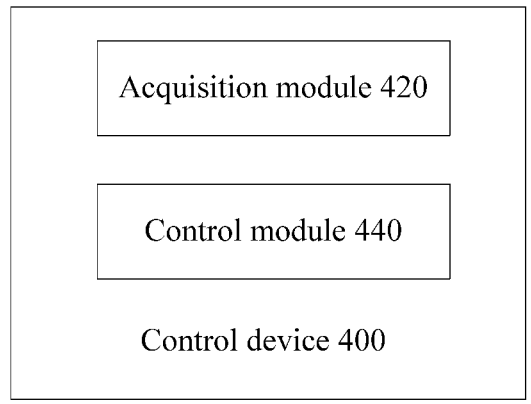
FIG. 8 is an example functional structural diagram of a control device according to another example embodiment of the present application.

Corresponding to the volume control method shown in FIG. 2, as shown in FIG. 8, another example embodiment of the present application provides a control device 400, comprising:

an acquisition module 420, configured to acquire volume information of a first device; and a control module 440, configured to: in response to that the acquired volume information of the first device satisfies a predetermined condition, control volume of the control device.

The following describes example functions of the modules in the control device of this embodiment of the present application with reference to FIG. 8.

The acquisition module 420 is configured to acquire the volume information of the first device.

In an example embodiment, the acquisition module 420 in the control device 400 carried by a user may obtain the volume information by receiving a sound signal played by the first device. Specifically, the acquisition module 420 may directly receive a sound signal sent by a loudspeaker of the first device, and acquire volume information of the sound signal.

The control module 440 is configured to: in response to that the acquired volume information of the first device satisfies the predetermined condition, control the volume of the control device.

Figure 9:
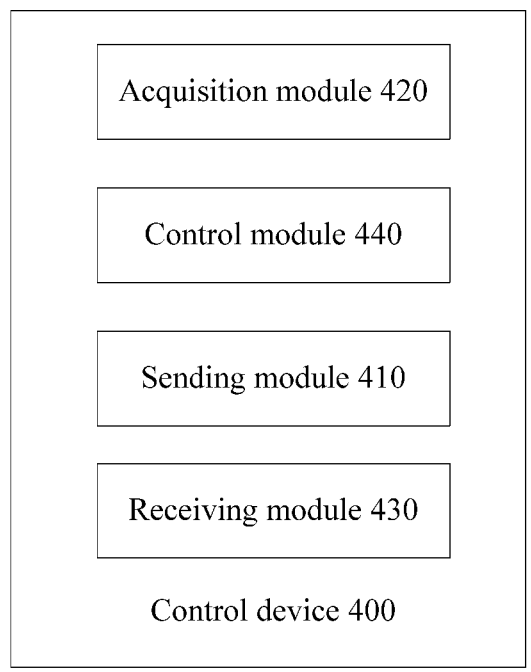
FIG. 9 is another example functional structural diagram of a control device according to another example embodiment of the present application.

In an example embodiment, when it is determined that the volume information of the first device satisfies the predetermined condition, as shown in FIG. 9, the control device 420 further comprises a sending module 410, wherein the sending module 410 sends device-related information of the control device to the first device, so as to notify the first device of existence and related information of the control device, to cause that the first device can establish a data connection to the control device. The device-related information may comprise information such as a device ID, device capability description, a device network address, and device location information of the control device.

In another example embodiment, a receiving module 430 in the control device 400 may acquire device-related information of the first device. In this way, the control device 400 may send a request to the first device, to cause that the first device can establish a data connection to the control device.

Then, in the volume control method of this embodiment, the first device may send played sound information to the control device in a wired or wireless manner. As shown in FIG. 9, the receiving module 430 in the control device 400 may receive the sound information, to cause that the control device can play the sound information in synchronization with the first device. When both the first device and the control device have a video playback capability, the first device may further send played video information to the control device at the same time.

In an example embodiment, the acquisition module 420 in the control device 400 may acquire the volume information of the first device and volume information of the control device, and the control module 440 may control the volume of the control device according to the volume information of the first device and the volume information of the control device.

Specifically, the control module 440 may compare a sum of the volume information of the first device and the volume information of the control device with a preset value, so as to control the volume of the control device. For example, when the sum of the volume information of the first device and the volume information of the control device is greater than the preset value, the control module 440 may decrease the volume of the control device; or, when the sum of the volume information of the first device and the volume information of the control device is less than the preset value, the control module 440 may increase the volume of the control device.

According to the control device of this embodiment of the present application, when the user who is listening to the sound signal played by the first device needs to go away from the first device, the control device carried by the user may play the same sound signal and control the volume of the control device, to cause that volume of the sound signal that the user listens to is not affected obviously.

In another example embodiment of the present application, a user who is listening to/watching a multimedia signal played by the first device needs to go away from the first device, but does not expect that volume of the multimedia signal that is listened to/watched is affected obviously; in this case, the control device carried by the user may discover and determine a second device, having a multimedia playback capability, near the user, and enable the second device to play a same sound signal and control volume of the second device, to cause that the multimedia signal that the user listens to/watches is not affected obviously.

In the foregoing example embodiment, the "first device" and the "second device" may be any intelligent device having a multimedia playback (sound playback and/or video playback) capability, and can perform data or signal transmission with another device in a wireless manner. The "control device" may be an intelligent user-wearable device or portable device or the like, and has at least one control capability, comprising multimedia playback control, of controlling another intelligent device in a wireless manner.

Figure 14:
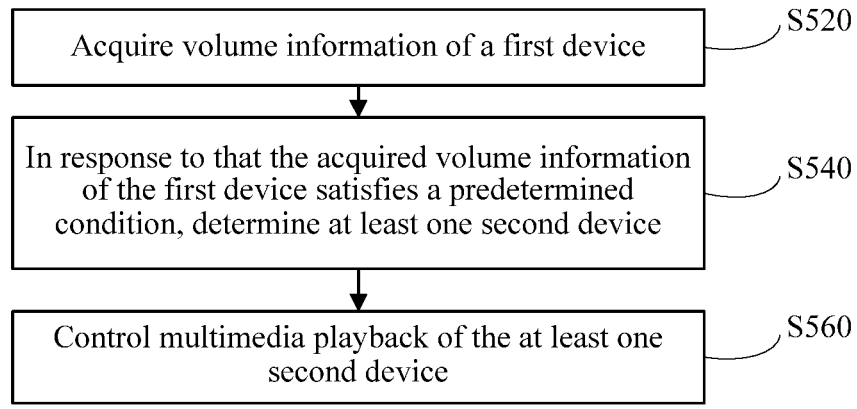
FIG. 14 is an example flowchart of steps of a multimedia playback control method according to an example embodiment of the present application.

According to the foregoing example embodiments, as shown in FIG. 14, a multimedia playback control method is provided, wherein the method may be implemented, for example, by a control device carried by a user. The method comprises:

S520: Acquire volume information of a first device.

S540: In response to that the acquired volume information of the first device satisfies a predetermined condition, determine at least one second device.

S560: Control multimedia playback of the at least one second device.

Example embodiments of S520 and S540 in the multimedia playback control method are similar to those of steps S120 and S140 in the volume control method shown in FIG. 1, and no further details are provided herein.

S560: Control the multimedia playback of the at least one second device.

After the first device sends played multimedia information (sound information and/or video information) to the at least one second device, the at least one second device can play the sound information and/or the video information in synchronization with the first device. In this case, a control device carried by a user going away from the first device playing the multimedia signal can control the at least one second device near the control device, to cause that the second device plays the sound information and/or the video information in synchronization with the first device.

According to the method of this embodiment of the present application, when a user who is listening to/watching the multimedia signal played by the first device needs to go away from the first device, the control device carried by the user may discover and determine a second device, having a multimedia playback capability, near the user, to cause that the second device plays the same multimedia signal, and to cause that volume of the multimedia signal that the user listens to/watches is not affected obviously.

In another example embodiment of the present application, the user who is listening to/watching the multimedia signal played by the first device needs to go away from the first device, but does not expect that volume of the multimedia signal that is listened to/watched is affected obviously; in this case, the control device carried by the user may play the same multimedia signal, to cause that volume of the multimedia signal that the user listens to/watches is not affected obviously.

In the foregoing example embodiment, the "first device" may be any intelligent device having a multimedia playback capability, and can perform data or signal transmission with another device in a wireless manner. The "control device" may be an intelligent user-wearable device or portable device or the like, and has a capability of acquiring and playing a multimedia signal.

Figure 15:
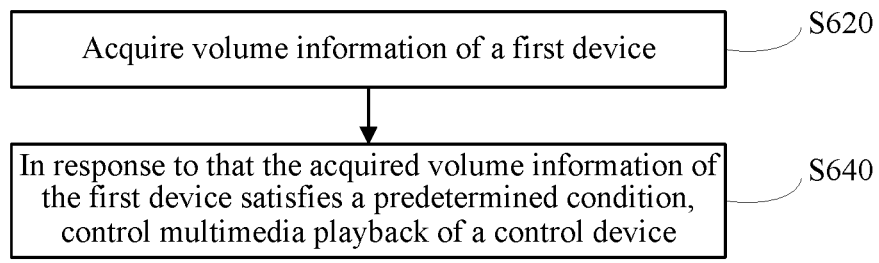
FIG. 15 is an example flowchart of steps of a multimedia playback control method according to another example embodiment of the present application.

According to the foregoing example embodiments, as shown in FIG. 15, a multimedia playback control method is provided, wherein the method may be implemented, for example, by a control device carried by a user. The method comprises:

S620: Acquire volume information of a first device.

S640: In response to that the acquired volume information of the first device satisfies a predetermined condition, control multimedia playback of the control device.

An example embodiment of S620 in the multimedia playback control method is similar to that of step S220 in the volume control method shown in FIG. 2, and no further details are provided herein.

S640: In response to that the acquired volume information of the first device satisfies the predetermined condition, control the multimedia playback of the control device.

The first device sends played sound information and/or video information to the control device, and the control device may acquire the sound information and/or video information played by the first device, and control the control device itself to play the sound information and/or video information in synchronization with the first device.

According to the method of this embodiment of the present application, when a user who is listening to/watching a multimedia signal played by the first device needs to go away from the first device, the control device carried by the user may play the same multimedia signal, to cause that volume of the multimedia signal that the user listens to/watches is not affected obviously.

A person skilled in the art may understand that, in the foregoing methods of the example embodiments of the present application, a sequence number of each step does not imply an execution sequence, and an execution sequence of each step should be determined according to its function and internal logic. The sequence number shall not constitute any limitation to implementation processes of the example embodiments described herein.

In addition, an embodiment of the present application further provides a computer readable medium, comprising a computer readable instruction, wherein when the computer readable instruction is executed, the step operations of the method in the example embodiment shown in FIG. 14 or FIG. 25 are executed.

Figure 16:
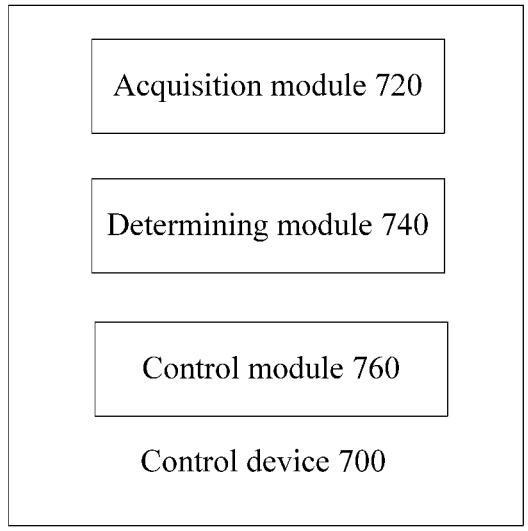
FIG. 16 is an example functional structural diagram of a control device according to another example embodiment of the present application.

Corresponding to the multimedia playback control method shown in FIG. 14, as shown in FIG. 16, another example embodiment of the present application provides a control device 700, comprising:

an acquisition module 720, configured to acquire volume information of a first device;

a determining module 740, configured to: in response to that the acquired volume information of the first device satisfies a predetermined condition, determine at least one second device; and a control module 760, configured to control multimedia playback of the at least one second device.

Example embodiments of the modules 720 and 740 in the control device are similar to those of the modules 320 and 340 in the control device shown in FIG. 3, and no further details are provided herein.

The control module 760 is configured to control the multimedia playback of the at least one second device.

In an example embodiment, the acquisition module 720 in the control device 700 may acquire a multimedia signal (sound information and/or video information) played by the first device, and the control module 760 may control the at least one second device to play the multimedia signal in synchronization with the first device.

According to the control device of this embodiment of the present application, when a user who is listening to/watching the multimedia signal played by the first device needs to go away from the first device, the control device carried by the user may discover and determine a second device, having a multimedia playback capability, near the user, to cause that the second device plays the same multimedia signal, and to cause that volume of the multimedia signal that the user listens to is not affected obviously.

Figure 17:
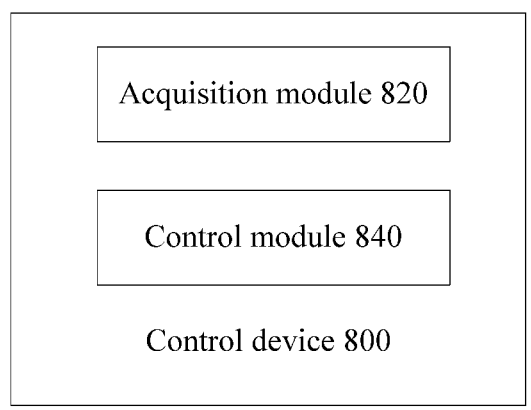
FIG. 17 is an example functional structural diagram of a control device according to another example embodiment of the present application.

Corresponding to the multimedia playback control method shown in FIG. 15, as shown in FIG. 17, another example embodiment of the present application provides a control device 800, comprising:

an acquisition module 820, configured to acquire volume information of a first device; and a control module 840, configured to: in response to that the acquired volume information of the first device satisfies a predetermined condition, control multimedia playback of the control device.

An example embodiment of the module 820 in the control device is similar to that of the module 420 in the control device shown in FIG. 8, and no further details are provided herein.

The control module 840 is configured to: in response to that the acquired volume information of the first device satisfies the predetermined condition, control the multimedia playback of the control device.

Figure 18:
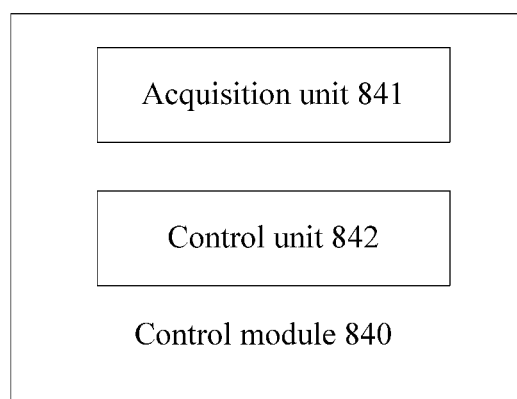
FIG. 18 is an example functional structural diagram of a control module according to another example embodiment of the present application.

As shown in FIG. 18, the control module may comprise an acquisition unit 841 and a control unit 842. The acquisition unit 841 may acquire a multimedia signal (sound information and/or video information) from the first device, and the control unit 842 may control the multimedia playback of the control device.

According to the control device of this embodiment of the present application, when a user who is listening to/watching the multimedia signal played by the first device needs to go away from the first device, the control device carried by the user may play the same multimedia signal, to cause that volume of the multimedia signal that the user listens to/watches is not affected obviously.

Figure 10:
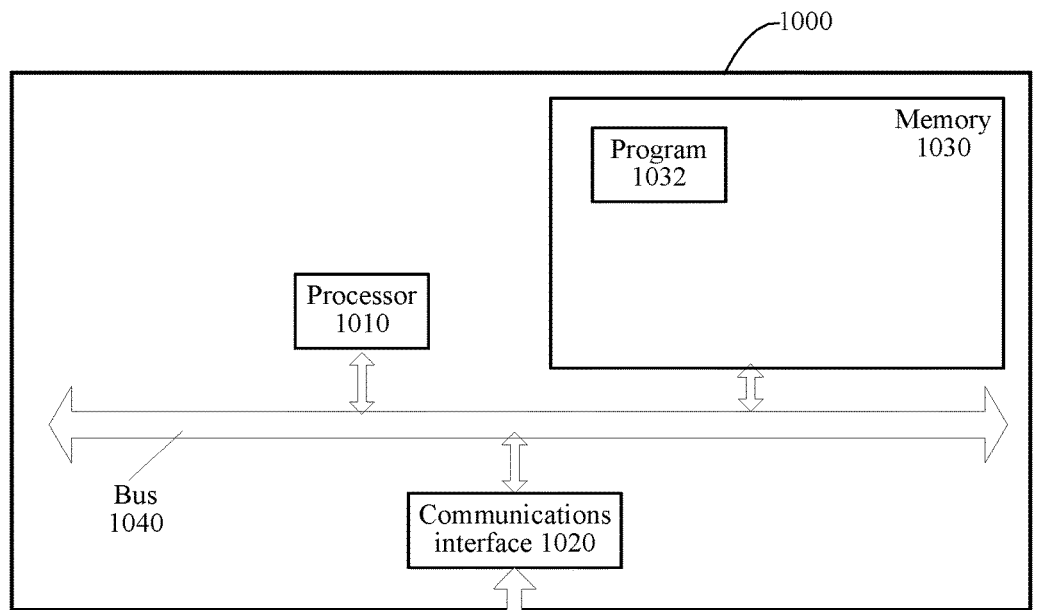
FIG. 10 is an example hardware structural diagram of a control device according to an example embodiment of the present application.

FIG. 10 is a schematic structural diagram of a control device 1000 according to an embodiment of the present application, and this embodiment of the present application does not limit a example implementation of the control device 1000. As shown in FIG. 10, the control device 1000 may comprise:

a processor 1010, a communications interface 1020, a memory 1030, and a communication bus 1040.

The processor 1010, the communications interface 1020, and the memory 1030 implement communication between each other through the communication bus 1040.

The communications interface 1020 is configured to communicate with a network element such as a client.

The processor 1010 is configured to execute a program 1032, and specifically may execute related functions of the control device in the device embodiment shown in FIG. 3 to FIG. 7.

Specifically, the program 1032 may comprise program code, and the program code comprises a computer operation instruction.

The processor 1010 may be a CPU, or an application specific integrated circuit (ASIC), or one or more integrated circuits configured to implement the embodiments of the present application.

The memory 1030 is configured to store the program 1032. The memory 1030 may comprise a high-speed RAM memory, and may further comprise a non-volatile memory, for example, at least one disk memory. The program 1032 specifically may implement the following operations:

acquiring volume information of a first device;

in response to that the acquired volume information of the first device satisfies a predetermined condition, determining at least one second device; and controlling volume of the at least one second device.

For example implementations of the operations in the program 1032, reference may be made to corresponding modules or units in the device embodiment, and no further details are provided herein. A person skilled in the art may clearly know that, for convenient and brief description, for the example operating process of the foregoing device and module, reference may be made to the corresponding descriptions in the foregoing device embodiment, and no further details are provided herein.

Figure 11:
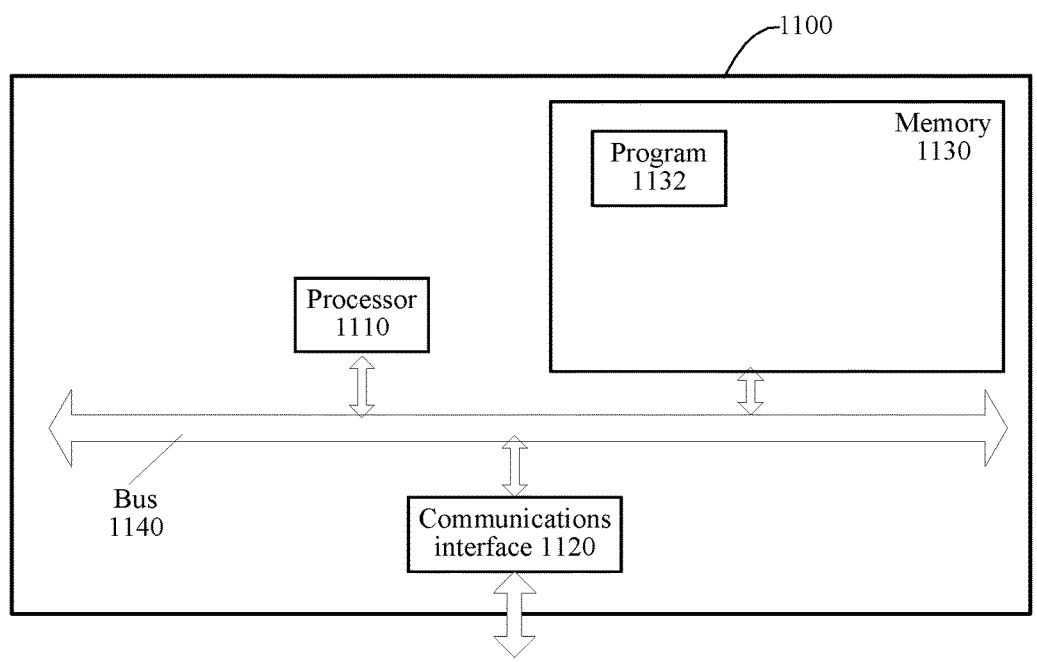
FIG. 11 is an example hardware structural diagram of a control device according to another example embodiment of the present application.

FIG. 11 is a schematic structural diagram of a control device 1100 according to an embodiment of the present application, and this embodiment of the present application does not limit a example implementation of the control device 1100. As shown in FIG. 11, the control device 1100 may comprise:

a processor 1110, a communications interface 1120, a memory 1130, and a communication bus 1140.

The processor 1110, the communications interface 1120, and the memory 1130 implement communication between each other through the communication bus 1140.

The communications interface 1120 is configured to communicate with a network element such as a client.

The processor 1110 is configured to execute a program 1132, and specifically may execute related functions of the control device in the device embodiment shown in FIG. 8 to FIG. 9.

Specifically, the program 1132 may comprise program code, and the program code comprises a computer operation instruction.

The processor 1110 may be a CPU, or an ASIC, or one or more integrated circuits configured to implement the embodiments of the present application.

The memory 1130 is configured to store the program 1132. The memory 1130 may comprise a high-speed RAM memory, and may further comprise a non-volatile memory, for example, at least one disk memory. The program 1132 specifically may implement the following operations:

acquiring volume information of a first device; and in response to that the acquired volume information of the first device satisfies a predetermined condition, controlling volume of the control device.

For example implementations of the operations in the program 1132, reference may be made to corresponding modules or units in the device embodiment, and no further details are provided herein. A person skilled in the art may clearly know that, for convenient and brief description, for the example operating process of the foregoing device and module, reference may be made to the corresponding descriptions in the foregoing device embodiment, and no further details are provided herein.

Figure 12:
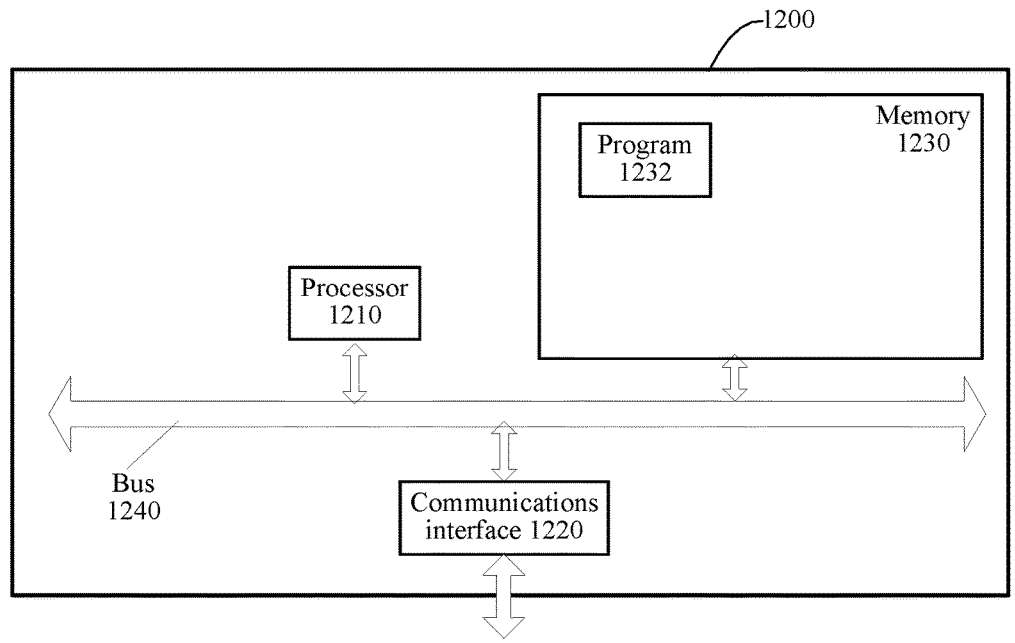
FIG. 12 is an example hardware structural diagram of a control device according to another example embodiment of the present application.

FIG. 12 is a schematic structural diagram of a control device 1200 according to an embodiment of the present application, and this embodiment of the present application does not limit an example implementation of the control device 1200. As shown in FIG. 12, this control device 1200 may comprise:

a processor 1210, a communications interface 1220, a memory 1230, and a communication bus 1240.

The processor 1210, the communications interface 1220, and the memory 1230 implement communication between each other through the communication bus 1240.

The communications interface 1220 is configured to communicate with a network element such as a client.

The processor 1210 is configured to execute a program 1232, and specifically may execute related functions of the control device in the device embodiment shown in FIG. 16.

Specifically, the program 1232 may comprise program code, and the program code comprises a computer operation instruction.

The processor 1210 may be a CPU, or an ASIC, or one or more integrated circuits configured to implement the embodiments of the present application.

The memory 1230 is configured to store the program 1232. The memory 1230 may comprise a high-speed RAM memory, and may further comprise a non-volatile memory, for example, at least one disk memory. The program 1232 specifically may implement the following operations:

acquiring volume information of a first device;

in response to that the acquired volume information of the first device satisfies a predetermined condition, determining at least one second device; and controlling multimedia playback of the at least one second device.

For example implementations of the operations in the program 1232, reference may be made to corresponding modules or units in the device embodiment, and no further details are provided herein. A person skilled in the art may clearly know that, for convenient and brief description, for the example operating process of the foregoing device and module, reference may be made to the corresponding descriptions in the foregoing device embodiment, and no further details are provided herein.

Figure 13:
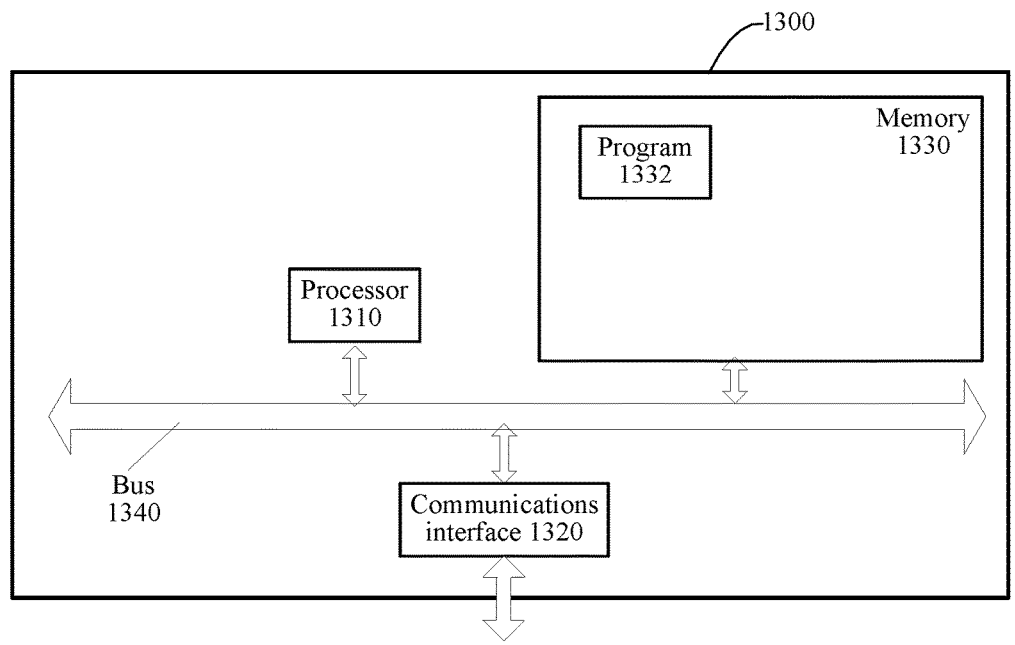
FIG. 13 is an example hardware structural diagram of a control device according to another example embodiment of the present application.

FIG. 13 is a schematic structural diagram of a control device 1300 according to an embodiment of the present application, and this embodiment of the present application does not limit an example implementation of the control device 1300. As shown in FIG. 13, the control device 1300 may comprise:

a processor 1310, a communications interface 1320, a memory 1330, and a communication bus 1340.

The processor 1310, the communications interface 1320, and the memory 1330 implement communication between each other through the communication bus 1340.

The communications interface 1320 is configured to communicate with a network element such as a client.

The processor 1310 is configured to execute a program 1332, and specifically may execute related functions of the control device in the device embodiment shown in FIG. 17 to FIG. 18.

Specifically, the program 1332 may comprise program code, and the program code comprises a computer operation instruction.

The processor 1310 may be a CPU, or an ASIC, or one or more integrated circuits configured to implement the embodiments of the present application.

The memory 1330 is configured to store the program 1332. The memory 1330 may comprise a high-speed RAM memory, and may further comprise a non-volatile memory, for example, at least one disk memory. The program 1332 specifically may implement the following operations:

acquiring volume information of a first device; and in response to that the acquired volume information of the first device satisfies a predetermined condition, controlling multimedia playback of the control device.

For example implementations of the operations in the program 1332, reference may be made to corresponding modules or units in the device embodiment, and no further details are provided herein. A person skilled in the art may clearly know that, for convenient and brief description, for the example operating process of the foregoing device and module, reference may be made to the corresponding descriptions in the foregoing device embodiment, and no further details are provided herein.

Although a topic described herein is provided in common context executed with reference to executions of an operating system and an application program in a computer system, a person skilled in the art may know that another implementation may be executed with reference to a program module of another type. Generally, the program module comprises a routine, a program, a component, a data structure, and a structure of another type that execute an example task or implement an example abstract data type. A person skilled in the art may understand that, the topic described herein may be implemented by using configuration of another computer system, comprising a handheld device, a multi-processor system, a microprocessor-based or programmable consuming electronic product, a small-size computer, a mainframe or the like; or by using a distributed computer environment in which a task is executed by a remote processing device connected to a communications network. In the distributed computer environment, the program module may be located in local and remote storage devices.

A person of ordinary skill in the art may be aware that, with reference to the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the various embodiments.

When the functions are implemented in a form of a software functional unit and sold or used as an independent product, the functions may be stored in a computer-readable storage medium. Based on such an understanding, the technical solutions of the various embodiments essentially, or the part contributing to the prior art, or a part of the technical solutions may be implemented in a form of a software product. The computer software product is stored in a storage medium, and comprises several instructions for instructing a computer device (which may be a personal computer, a server, a network device, or the like) to perform all or a part of the steps of the methods described in the embodiments described herein. The computer readable storage medium comprises a volatile and non-volatile, removable and non-removable medium that is implemented by using any method or technology used for storing information such as a computer readable instruction, a data structure, a program module, or other data. The computer readable storage medium specifically comprises, but not limited to, a USB disk, a removable hard disk, a read-only memory (ROM), a random access memory (RAM), an erasable programmable read-only memory (EPROM), an electrically erasable programmable read-only memory (EEPROM), a flash disk or another solid memory technology, a digital video disk (DVD), an HD-DVD, a blue-ray or another optical storage device, a tape, disk storage or another magnetic storage device, or any other medium that can be used for storing required information and can be accessed by the computer.

The foregoing example embodiments are merely used for describing the present invention, rather than limiting the present invention. A person of ordinary skill in the art may made various changes and modifications without departing from the spirit and scope of the present invention, and therefore, all equivalent technical solutions shall belong to the scope of the present invention, and the protection scope of the present invention shall be subject to the claims.

What is claimed is:

1. A method, comprising:
    acquiring, by a system comprising a processor, volume information of a first device; and
    in response to determining, by the system, that the volume information of the first device satisfies a predetermined condition that includes the volume information being less than a threshold:
        receiving, by the system, device signals sent by one or more other devices, wherein the device signals contain related information of the one or more other devices that send the device signals,
        determining, by the system, at least one second device from the one or more other devices according to the related information,
        at least one of sending, by the system, device-related information of the at least one second device to the first device, or receiving, by the system, device-related information of the first device from the first device and sending, by the system, the device-related information of the first device to the at least one second device,
        establishing, by the system, a data connection between the first device and the at least one second device such that the first device sends sound information that is being played currently by the first device to the at least one second device via the established data connection so as to cause the at least one second device to play the sound information in synchronization with the first device, and
        controlling, by the system, a volume of the at least one second device.

2. The method of claim 1, wherein the determining the at least one second device comprises:
    sending a query signal in a wireless manner;
    receiving at least one response signal in response to the query signal; and
    determining the at least one second device according to the at least one response signal.

3. The method of claim 1, wherein the determining the at least one second device comprises:
    receiving a device signal of at least one device; and
    determining the at least one second device according to the device signal of the at least one device.

4. The method of claim 1, wherein the controlling the volume of the at least one second device comprises:
    acquiring other volume information of the at least one second device; and
    controlling the volume of at least one of the at least one second device according to at least one of the volume information of the first device or the other volume information of the at least one second device.

5. The method of claim 4, wherein the controlling the volume of the at least one of the at least one second device according to the at least one of the volume information of the first device or the other volume information of the at least one second device comprises:
    comparing a sum of the volume information of the first device and the other volume information of the at least one second device with a preset value; and
    in response to the sum of the volume information of the first device and the other volume information of the at least one second device being greater than the preset value, decreasing the volume of the at least one of the at least one second device; or
    in response to the sum of the volume information of the first device and the other volume information of the at least one second device being less than the preset value, increasing the volume of the at least one of the at least one second device.

6. A method, comprising:
    acquiring, by a control device comprising a processor, volume information of a first device; and
    in response to that the volume information of the first device being determined to satisfy a predetermined condition that includes the volume information being less than a threshold:
        at least one of sending, by the control device, device-related information of the control device to the first device or acquiring, by the control device, device-related information of the first device,
        establishing, by the control device, a data connection between the first device and the control device such that the first device sends sound information that is being played currently by the first device to the control device via the established data connection so as to cause the control device to play the sound information in synchronization with the first device, and controlling, by the control device, a volume of the control device.

7. The method of claim 6, further comprising:
receiving, by the control device, the sound information played by the first device.

8. The method of claim 6, wherein the volume information of the first device is first volume information, and wherein the controlling the volume of the control device comprises:
acquiring second volume information of the control device; and
controlling the volume of the control device according to the first volume information of the first device and the second volume information of the control device.

9. The method of claim 8, wherein the controlling the volume of the control device according to the first volume information of the first device and the second volume information of the control device comprises:
comparing a sum of the first volume information of the first device and the second volume information of the control device with a preset value, and
in response to the sum of the first volume information of the first device and the second volume information of the control device being greater than the preset value, decreasing the volume of the control device, or
in response to the sum of the first volume information of the first device and the second volume information of the control device being less than the preset value, increasing the volume of the control device.

10. A device, comprising:
a processor, coupled to a memory, that executes or facilitates execution of executable modules, comprising:
an acquisition module configured to acquire volume information of a first device; and
a control module configured to, in response to a determination that the volume information of the first device satisfies a predetermined condition that includes the volume information being less than a threshold:
receive device signals sent by one or more other devices, wherein the device signals contain related information of the one or more other devices that send the device signals,
determine at least one second device from the one or more other devices according to the related information,
at least one of send device-related information of the at least one second device to the first device, or receive device-related information of the first device from the first device and send the device-related information of the first device to the at least one second device,
establish a data connection between the first device and the at least one second device such that the first device sends sound information that is being played currently by the first device to the at least one second device via the established data connection so as to cause the at least one second device to play the sound information in synchronization with the first device, and
control a volume of the at least one second device.

11. The device of claim 10, wherein the control module is further configured to:
send a query signal wirelessly,
receive at least one response signal in response to the query signal, and
determine the at least one second device according to the at least one response signal.

12. The device of claim 10, wherein the control module is further configured to:
receive a device signal of at least one device, and
determine the at least one second device according to the device signal of the at least one device.

13. The device of claim 10, wherein the volume information of the first device is first volume information, and wherein the acquisition unit is further configured to:
acquire second volume information of the at least one second device, and
the control module is further configured to control the volume of at least one of the at least one second device according to the first volume information of the first device and the second volume information of the at least one second device.

14. The device of claim 13, wherein the control module is configured to:
compare a sum of the first volume information of the first device and the second volume information of the at least one second device with a preset value, and
in response to the sum of the first volume information of the first device and the second volume information of the at least one second device being greater than the preset value, decrease the volume of the at least one of the at least one second device, or
in response to the sum of the first volume information of the first device and the second volume information of the at least one second device being less than the preset value, increase the volume of the at least one of the at least one second device.

15. A control device, comprising:
a processor, coupled to a memory, that executes or facilitates execution of executable modules, comprising:
an acquisition module configured to acquire volume information of a first device; and
a control module configured to, in response to a determination that the volume information of the first device satisfies a predetermined condition that includes the volume information being less than a threshold:
at least one of send device-related information of the control device to the first device or acquire device-related information of the first device,
establish a data connection between the first device and the control device such that the first device sends sound information that is being played currently by the first device to the control device via the established data connection so as to cause the control device to play the sound information in synchronization with the first device, and
control a volume of the control device.

16. The control device of claim 15, wherein
the control module is further configured to receive, from the first device, the sound information played by the first device.

17. The control device of claim 15, wherein the acquisition unit is further configured to:
acquire other volume information of the control device; and the control module is further configured to:
control the volume information of the control device according to the volume information of the first device and the other volume information of the control device.

18. The control device of claim 17, wherein the control module is configured to:
compare a sum of the volume information of the first device and the other volume information of the control device with a preset value, and
in response to the sum of the volume information of the first device and the other volume information of the control device being greater than the preset value, decrease the volume of the control device, or
in response to the sum of the volume information of the first device and the other volume information of the control device being less than the preset value, increase the volume of the control device.

19. A method, comprising:
acquiring, by a system comprising a processor, volume information of a first device; and
in response to that the volume information of the first device being determined to satisfy a defined condition that includes the volume information being less than a threshold:
receiving, by the system, device signals sent by one or more other devices, wherein the device signals contain related information of the one or more other devices that send the device signals,
determining a second device from the one or more other devices according to the related information,
at least one of sending, by the system, device-related information of the second device to the first device, or receiving, by the system, device-related information of the first device from the first device and sending, by the system, the device-related information of the first device to the second device,
establishing, by the system, a data connection between the first device and the second device such that the first device sends sound information that is being played currently by the first device to the second device via the established data connection so as to cause the second device to play the sound information in synchronization with the first device, and
controlling, by the system, multimedia playback, comprising playback of the sound information, of the second device.

20. The method of claim 19, wherein the determining the second device comprises:
sending a query signal wirelessly;
receiving a response signal in response to the query signal; and
determining the second device according to the response signal.

21. The method of claim 19, wherein the determining the second device comprises:
receiving a device signal of another device; and
determining the second device according to the device signal of the other device.

22. The method of claim 19, wherein the controlling the multimedia playback of the second device comprises:
controlling the second device to play the sound information or video information played by the first device.

23. A method, comprising:
acquiring, by a system comprising a processor, volume information of a first device; and
in response to determining that the volume information of the first device satisfies a predetermined condition that includes the volume information being less than a threshold:
at least one of sending, by the system, device-related information of a control device to the first device or acquiring, by the system, device-related information of the first device,
establishing, by the system, a data connection between the first device and the control device such that the first device sends sound information that is being played currently by the first device to the control device via the established data connection so as to cause the control device to play the sound information in synchronization with the first device, and
controlling, by the system, multimedia playback, comprising playback of the sound information, of the control device.

24. The method of claim 23, wherein the controlling the multimedia playback of the control device comprises:
acquiring the sound information or video information played by the first device; and
controlling the control device to render the sound information or the video information.

25. A control device, comprising:
a processor, coupled to a memory, that executes or facilitates execution of executable modules, comprising:
an acquisition module configured to acquire volume information of a first device; and
a control module configured to, in response to a determination that the volume information of the first device satisfies a predetermined condition that includes the volume information being less than a threshold:
receive device signals sent by one or more other devices, wherein the device signals contain related information of the one or more other devices that send the device signals,
determine at least one second device from the one or more other devices according to the related information;
at least one of send device-related information of the at least one second device to the first device, or receive device-related information of the first device from the first device and send the device-related information of the first device to the at least one second device;
establish a data connection between the first device and the at least one second device such that the first device sends sound information that is being played currently by the first device to the at least one second device via the established data connection so as to cause the at least one second device to play the sound information in synchronization with the first device; and
control multimedia playback, comprising playback of the sound information, of the at least one second device.

26. The control device of claim 25, wherein the control module is further configured to:
send a query signal in a wireless manner;
receive at least one response signal in response to the query signal; and
determine the at least one second device according to the at least one response signal.

27. The control device of claim 25, wherein the control module is further configured to:

receive a device signal of at least one device; and
determine the at least one second device according to the device signal of the at least one device.

28. The control device of claim 25, wherein the control module is further configured to:
control the at least one second device to play the sound information or video information played by the first device.

29. The control device of claim 25, wherein the control module is further configured to:
acquire other volume information of the at least one second device; and
control the volume of at least one of the at least one second device according to at least one of the volume information of the first device or the other volume information of the at least one second device.

30. The control device of claim 29, wherein the control module is further configured to:
compare a sum of the volume information of the first device and the other volume information of the at least one second device with a preset value; and
in response to the sum of the volume information of the first device and the other volume information of the at least one second device being greater than the preset value, decrease the volume of the at least one of the at least one second device; or
in response to the sum of the volume information of the first device and the other volume information of the at least one second device being less than the preset value, increase the volume of the at least one of the at least one second device.

31. A control device, comprising:
a processor, coupled to a memory, that executes or facilitates execution of executable modules, comprising:
an acquisition module configured to acquire volume information of a first device; and
a control module configured to, in response to the volume information of the first device satisfying a predetermined condition that includes the volume information being less than a threshold:
at least one of send device-related information of the control device to the first device or acquire device-related information of the first device,
establish a data connection between the first device and the control device such that the first device sends sound information that is being played currently by the first device to the control device via the established data connection so as to cause the control device to play the sound information in synchronization with the first device, and
control multimedia playback, comprising playback of the sound information, of the control device.

32. The control device of claim 31, wherein the control module is further configured to:
acquire the sound information or video information played by the first device; and
control the control device to play the sound information or the video information.

33. The control device of cham 31, wherein the control module is further configured to:
receive the sound information played by the first device.

34. The control device of claim 32, wherein the control module is further configured to:
compare a sum of the first volume information of the first device and the second volume information of the control device with a preset value, and
in response to the sum of the first volume information of the first device and the second volume information of the control device being greater than the preset value, decrease the volume of the control device, or
in response to the sum of the first volume information of the first device and the second volume information of the control device being less than the preset value, increase the volume of the control device.

35. A computer readable storage device, comprising at least one executable instruction, which, in response to execution, causes a control device comprising a processor to perform operations, comprising:
acquiring volume information of a first device; and
in response to determining that the volume information of the first device satisfies a predetermined condition that includes the volume information being less than a threshold:
receiving device signals sent by one or more other devices, wherein the device signals contain related information of the one or more other devices that send the device signals,
determining a second device from the one or more other devices according to the related information,
at least one of sending device-related information of the second device to the first device, or receiving device-related information of the first device from the first device and sending, by the system, the device-related information of the first device to the device,
establishing a data connection between the first device and the second device such that the first device sends sound information that is being played currently by the first device to the second device via the established data connection so as to cause the second device to play the sound information in synchronization with the first device, and
controlling a volume of the second device.

36. A computer readable storage device, comprising at least one executable instruction, which, in response to execution, causes a control device comprising a processor to perform operations, comprising:
acquiring volume information of a first device resulting in acquired volume information; and
in response to that the acquired volume information of the first device satisfies a predetermined condition that includes the volume information being less than a threshold:
at least one of sending device-related information of the control device to the first device or acquiring, by the control device, device-related information of the first device,
establishing a data connection between the first device and the control device such that the first device sends sound information that is being played currently by the first device to the control device via the established data connection so as to cause the control device to play the sound information in synchronization with the first device, and
controlling volume of the control device.

37. The computer readable storage device of claim 36, the operations further comprising:
receiving the sound information played by the first device.

38. The computer readable storage device of claim 36, wherein the acquired volume information is first volume information, and wherein the controlling the volume of the control device comprises:
acquiring second volume information of the control device, and controlling the volume of the control device according to the first volume information of the first device and the second volume information of the control device.

39. The computer readable storage device of claim 35, wherein the determining the second device comprises:
sending a query signal in a wireless manner,
receiving at least one response signal in response to the query signal, and
determining the second device according to the at least one response signal.

40. The computer readable storage device of claim 35, wherein the determining the second device comprises:
receiving a device signal of at least one device, and
determining the second device according to the device signal of the at least one device.

41. The computer readable storage device of claim 35, wherein the controlling the volume of the at least one second device comprises:
acquiring other volume information of the at least one second device; and
controlling the volume of at least one of the at least one second device according to at least one of the volume information of the first device or the other volume information of the at least one second device.

42. The computer readable storage device of claim 41, wherein the controlling the volume of the at least one of the at least one second device according to the at least one of the volume information of the first device or the other volume information of the at least one second device comprises:
comparing a sum of the volume information of the first device and the other volume information of the at least one second device with a preset value; and
in response to the sum of the volume information of the first device and the other volume information of the at least one second device being greater than the preset value, decreasing the volume of the at least one of the at least one second device; or
in response to the sum of the volume information of the first device and the other volume information of the at least one second device being less than the preset value, increasing the volume of the at least one of the at least one second device.

43. The control device of claim 38, wherein the controlling the volume of the control device according to the first volume information of the first device and the second volume information of the control device comprises:
comparing a sum of the first volume information of the first device and the second volume information of the control device with a preset value, and
in response to the sum of the first volume information of the first device and the second volume information of the control device being greater than the preset value, decreasing the volume of the control device, or
in response to the sum of the first volume information of the first device and the second volume information of the control device being less than the preset value, increasing the volume of the control device.

* * * * *